United States Patent
Sato et al.

(10) Patent No.: US 9,865,499 B2
(45) Date of Patent: Jan. 9, 2018

(54) METHOD AND APPARATUS FOR GAP FILL USING DEPOSITION AND ETCH PROCESSES

(71) Applicant: Tokyo Electron Limited, Tokyo (JP)

(72) Inventors: Jun Sato, Iwate (JP); Hiroyuki Kikuchi, Iwate (JP); Masahiro Murata, Iwate (JP); Shigehiro Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/185,238

(22) Filed: Jun. 17, 2016

(65) Prior Publication Data

US 2016/0379868 A1  Dec. 29, 2016

(30) Foreign Application Priority Data

Jun. 23, 2015  (JP) ................ 2015-126036

(51) Int. Cl.

| | |
|---|---|
| *H01L 21/768* | (2006.01) |
| *H01L 21/67* | (2006.01) |
| *H01L 21/687* | (2006.01) |
| *H01L 21/02* | (2006.01) |
| *H01L 21/311* | (2006.01) |
| *C23C 16/455* | (2006.01) |
| *C23C 16/04* | (2006.01) |
| *C23C 16/40* | (2006.01) |

(52) U.S. Cl.
CPC ...... *H01L 21/76802* (2013.01); *C23C 16/045* (2013.01); *C23C 16/402* (2013.01); *C23C 16/45534* (2013.01); *H01L 21/0217* (2013.01); *H01L 21/02164* (2013.01); *H01L 21/02211* (2013.01); *H01L 21/02271* (2013.01); *H01L 21/31116* (2013.01); *H01L 21/67069* (2013.01); *H01L 21/68714* (2013.01)

(58) Field of Classification Search
CPC ......... H01L 21/02271; H01L 21/02164; H01L 21/0217; H01L 21/02211
See application file for complete search history.

(56) References Cited

U.S. PATENT DOCUMENTS

| | | | |
|---|---|---|---|
| 8,158,522 B2 * | 4/2012 | Sirajuddin | .......... H01L 21/3086 257/E21.218 |
| 8,697,519 B2 * | 4/2014 | Jee | .................. H01L 29/7889 257/E21.41 |

(Continued)

FOREIGN PATENT DOCUMENTS

JP  5599350  10/2014

*Primary Examiner* — Whitney T Moore
(74) *Attorney, Agent, or Firm* — IPUSA, PLLC

(57) ABSTRACT

A method for depositing a silicon-containing film is performed by causing a silicon-containing gas to adsorb on a first surface of a depression formed in a second surface of a substrate by supplying the silicon-containing gas to the substrate. A silicon component contained in the silicon-containing gas adsorbed on the first surface of the depression is partially etched by supplying an etching gas to the substrate. A silicon-containing film is deposited in the depression by supplying a reaction gas reactable with the silicon component to the substrate so as to produce a reaction product by causing the reaction gas to react with the silicon component left in the depression without being etched.

15 Claims, 12 Drawing Sheets

(56) References Cited

U.S. PATENT DOCUMENTS

| | | | | |
|---|---|---|---|---|
| 2001/0028922 | A1* | 10/2001 | Sandhu | C23C 16/045 427/255.27 |
| 2010/0260936 | A1* | 10/2010 | Kato | H01L 21/67109 427/255.28 |
| 2011/0073931 | A1* | 3/2011 | Hirota | H01L 21/0214 257/321 |

* cited by examiner

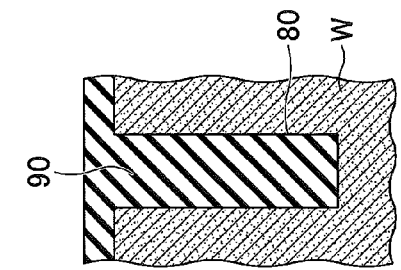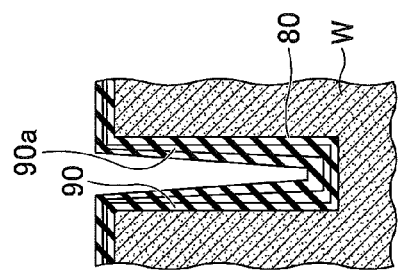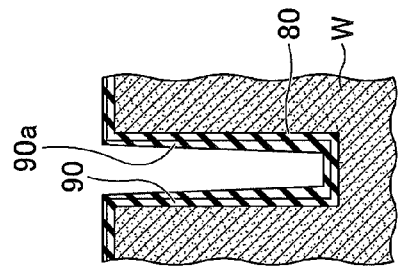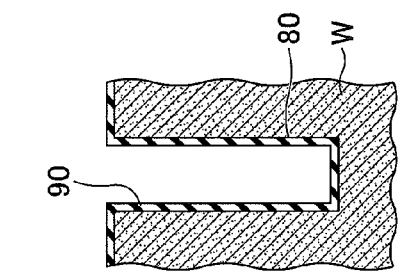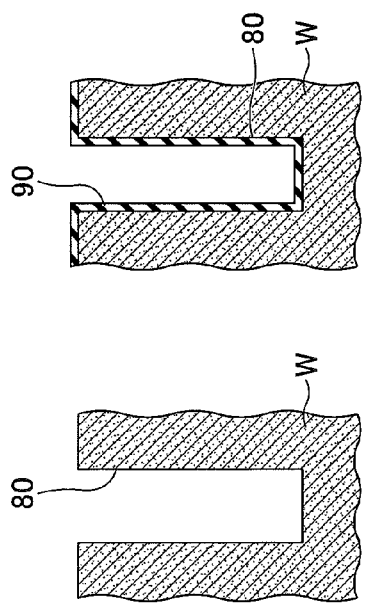

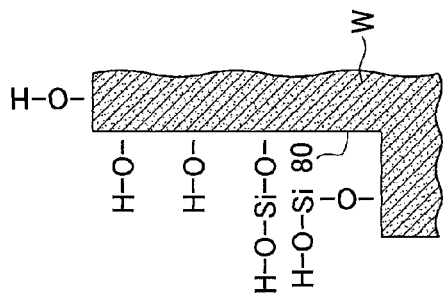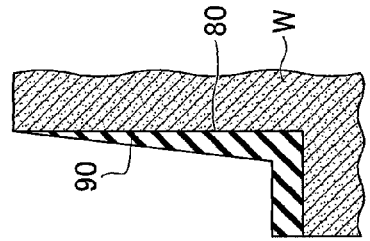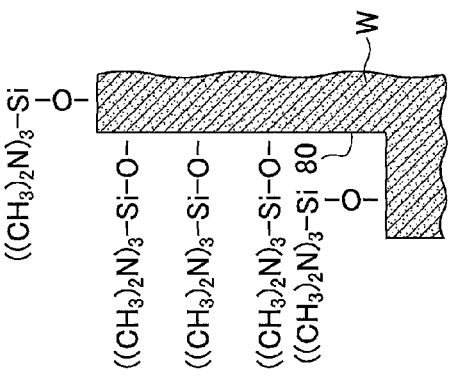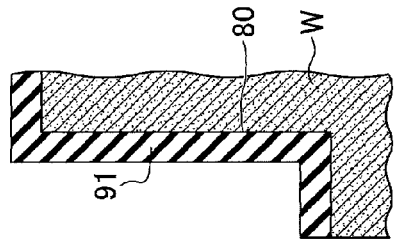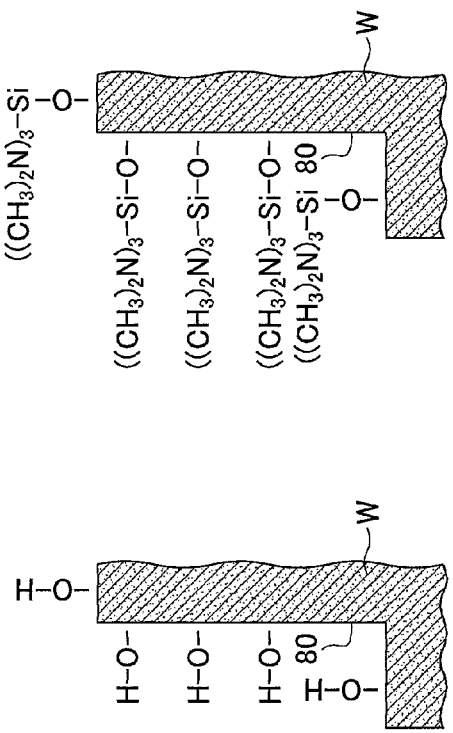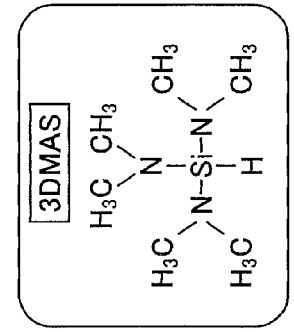
FIG.10A  FIG.10B  FIG.10C  FIG.10D

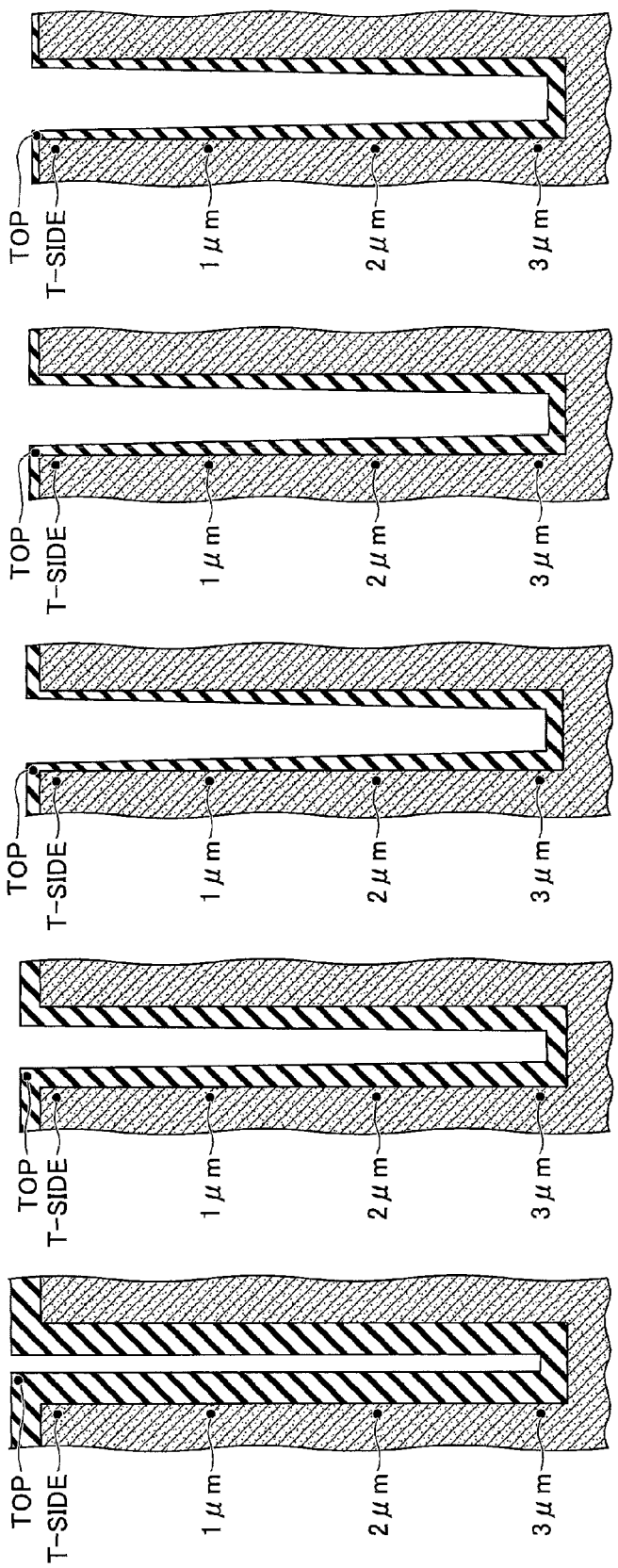

METHOD AND APPARATUS FOR GAP FILL USING DEPOSITION AND ETCH PROCESSES

CROSS-REFERENCE TO RELATED APPLICATIONS

This patent application is based upon and claims the benefit of priority of Japanese Patent Application No. 2015-126036 filed on Jun. 23, 2015, the entire contents of which are incorporated herein by reference.

BACKGROUND OF THE INVENTION

1. Field of the Invention

The present invention relates to a method and an apparatus for depositing a silicon-containing film.

2. Description of the Related Art

As described in Japanese Patent No. 5599350, a film deposition method performed in a vacuum chamber is known that includes an adsorption step of causing a first reaction gas to adsorb on a substrate, a deposition step of depositing a reaction product on the substrate by causing the first gas to adsorb on the substrate to react with a second reaction gas, a treatment/etching step of modifying and etching the reaction product by supplying an activated modification gas and an activated etching gas to the substrate, and an etching step of etching the reaction product by supplying an etching gas to the substrate, wherein the etching step is performed after repeating the adsorption step, the depositing step and the treatment/etching step in this order.

According to the film deposition method, the etching is performed immediately after the reaction product is deposited on a recessed portion such as a trench formed in a surface of the substrate. Hence, an opening (upper end) of the recessed portion can be prevented from being blocked by the reaction product, and the film deposition for filling the recessed portion with the film can be performed while preventing a void and a seam from being generated in the film.

However, in the method described in Japanese Patent No. 5599350, plasma is used to perform the treatment/etching step and the etching step. When using the plasma, it is difficult to make shapes of the film filled in the recessed portions uniform across the wafer, and the film deposition apparatus is likely to grow in size due to the installation of the plasma unit.

SUMMARY OF THE INVENTION

Accordingly, embodiments of the present invention may provide a method and an apparatus for depositing a silicon-containing film that can fill a recess formed in a surface of a substrate with a silicon-containing film without generating defects such as a void and a seam.

According to an embodiment of the present invention, there is provided a method for depositing a silicon-containing film. In the method, a silicon-containing gas is caused to adsorb on a first surface of a depression formed in a second surface of a substrate by supplying the silicon-containing gas to the substrate. A silicon component contained in the silicon-containing gas adsorbed on the first surface of the depression is partially etched by supplying an etching gas to the substrate. A silicon-containing film is deposited in the depression by supplying a reaction gas reactable with the silicon component to the substrate so as to produce a reaction product by causing the reaction gas to react with the silicon component left in the depression without being etched.

According to another embodiment of the present invention, there is provided a film deposition apparatus that includes a process chamber, and a turntable provided in the process chamber to receive a substrate in a surface thereof. A source gas supply part is provided above the turntable and configured to supply a source gas to the turntable. An etching gas supply part is provided above the turntable and configured to supply an etching gas to the turntable. A reaction gas supply part is provided above the turntable and configured to supply a reaction gas reactable with the source gas to the turntable. The source gas supply part, the etching gas supply part and the reaction gas supply part are arranged along a rotational direction of the turntable in this order at intervals. A control unit is configured to switch between a first film deposition cycle and a second film deposition cycle. The first film deposition cycle is performed to rotate the turntable so as to cause the substrate to pass through the source gas supply part, the etching gas supply part and the reaction gas supply part in series. The second film deposition cycle is performed to rotate the turntable so as to cause the substrate to alternately pass through the source gas supply part and the reaction gas supply part.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 7A through 7E are diagrams illustrating an example of a series of processes according to an embodiment of the present invention;

FIGS. 10A through 10D are diagrams for explaining a chemical reaction generated during a film deposition and etching combined cycle of a method for depositing a silicon-containing film according to an embodiment of the present invention;

FIGS. 11A through 11E are diagrams showing an experimental result of a method for depositing a silicon-containing film of a working example of the present invention.

DETAILED DESCRIPTION OF EMBODIMENTS

Exemplary embodiments of the present invention are described below, with reference to accompanying drawings.

[Film Deposition Apparatus]

To begin with, a film deposition apparatus according to an embodiment of the present invention is described below.

Figure 1:
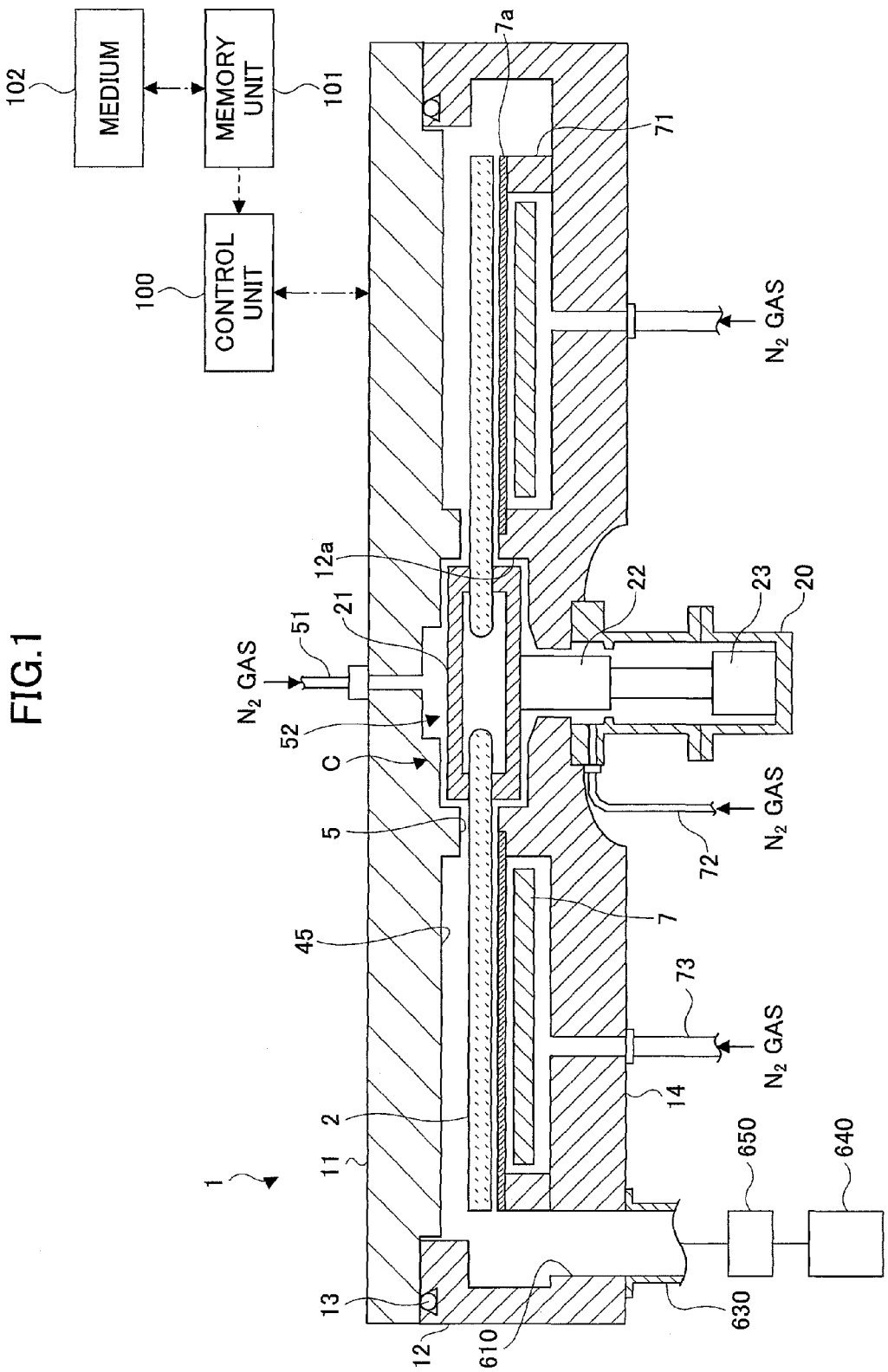
FIG. 1 is a cross-sectional view illustrating an example of a film deposition apparatus according to an embodiment of the present invention.
Figure 2:
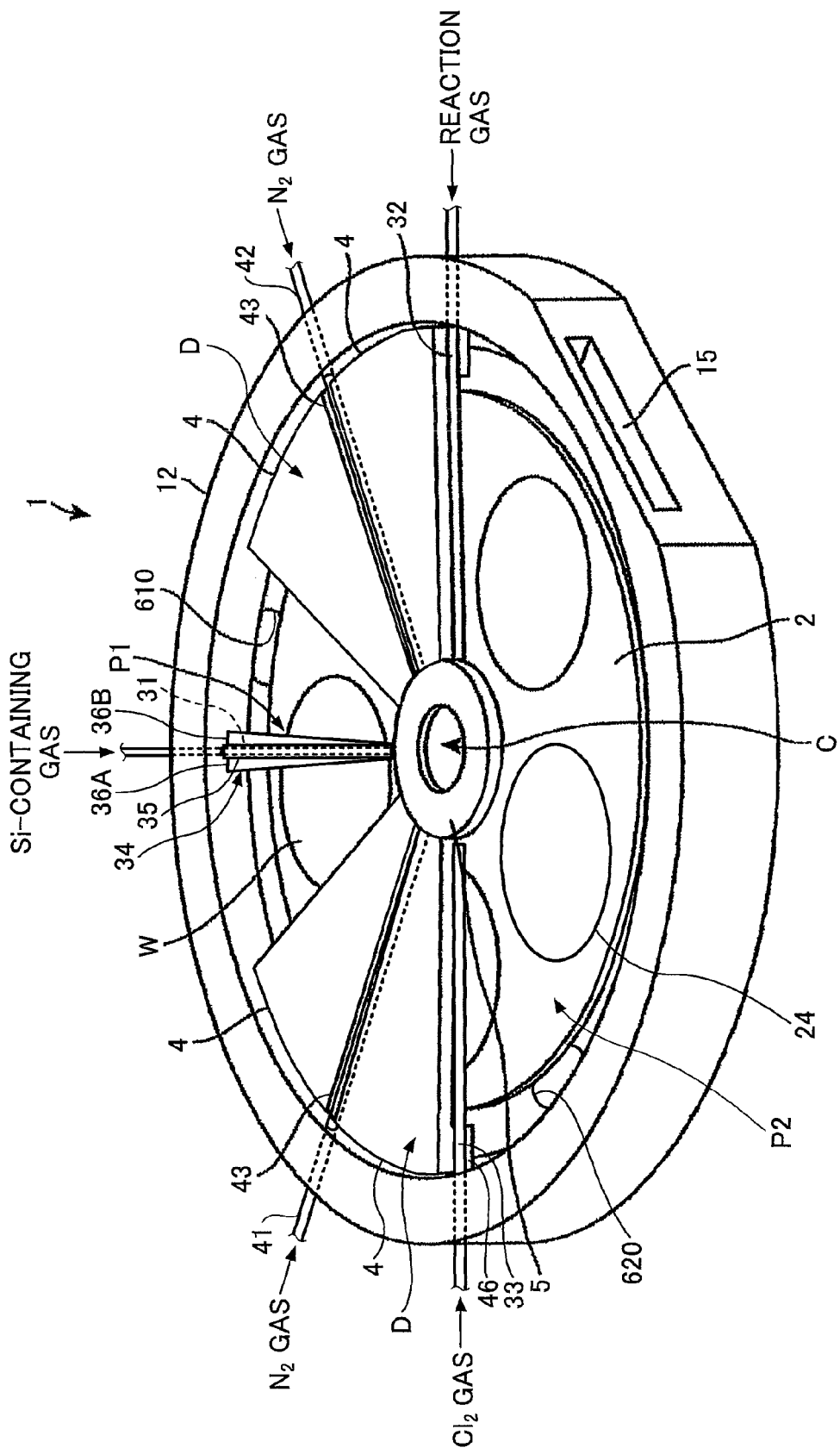
FIG. 2 is a perspective view illustrating an example of a film deposition apparatus according to an embodiment of the present invention.
Figure 3:
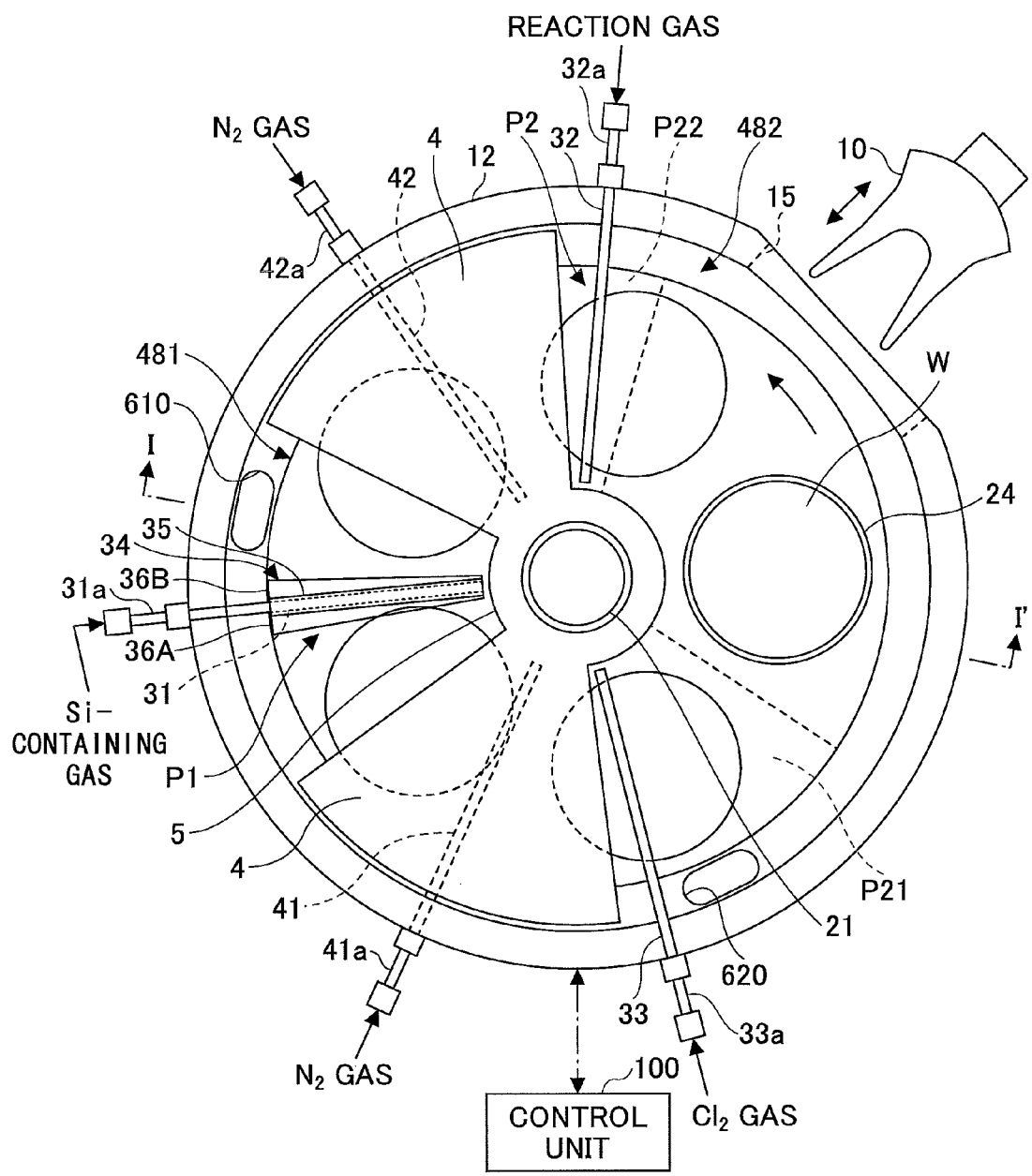
FIG. 3 is a schematic top view illustrating an example of a film deposition apparatus according to an embodiment of the present invention.

FIG. 1 is a cross-sectional view of an example of a film deposition apparatus according to an embodiment. FIG. 2 is a perspective view of an example of the film deposition apparatus according to the embodiment. FIG. 3 is a schematic top view of an example of the film deposition apparatus according to the embodiment.

Referring to FIGS. 1 through 3, the film deposition apparatus of the embodiment includes a vacuum chamber (or just a "chamber") 1 having a substantially circular shape in its plan view and a flattened shape in its side view, and a turntable 2 having its rotational center in the center of the chamber 1. The chamber 1 includes a chamber body 12 having a bottomed cylindrical shape, and a ceiling plate 11, which is detachably provided on the upper surface of the chamber body 12 through a sealing member 13 (see FIG. 1) such as an O-ring to hermetically seal the chamber 1.

The turntable 2 is fixed to a core portion 21 formed in a cylindrical shape at the center portion of the turntable 2. The core unit 21 is fixed to the upper end of a rotational shaft 22 extending in the vertical direction. The rotational shaft 22 penetrates through a bottom part 14 of the chamber 1. The lower end of the rotational shaft 22 is attached to a drive part 23, which causes the rotational shaft 22 (see FIG. 1) to rotate around the vertical axis of the rotational shaft 22. The rotational shaft 22 and the drive part 23 are accommodated in a cylindrical case body 20 whose upper surface is opened. A flange on the upper surface of the case body 20 is hermetically attached to the lower surface of a bottom part 14 of the chamber 1, thereby isolating the inner atmosphere of the case body 20 from the outer atmosphere.

As illustrated in FIGS. 2 and 3, circular concave portions 24 for receiving a plurality of (five in the example of the drawings) semiconductor wafers (which is hereinafter referred to as "wafers") are formed in a surface of the turntable 2 along a rotational direction (a circumferential direction) of the turntable 2. FIG. 3 illustrates a single wafer W only in a single circular concave portion 24 for the sake of convenience. The inner diameter of the circular concave portion 24 is slightly greater than the diameter of the wafer W by, for example, 4 mm. The depth of the circular concave portion 24 is substantially equal to the thickness of the wafer W. Accordingly, when the wafer W is placed in the circular concave portion 24, the height of the surface of the wafer W is approximately the same as the height of the surface of the turntable in an area where the wafer is not placed.

FIGS. 2 and 3 are diagrams for illustrating the structure inside the vacuum chamber 1. For the sake of convenience, the ceiling plate 11 is omitted from illustration in FIGS. 2 and 3. As illustrated in FIGS. 2 and 3, a source gas nozzles 31, a reaction gas nozzle 32, an etching gas nozzle 33, and separation gas nozzles 41 and 42, each of which is made of, for example, quartz, are arranged above the turntable 2. In the example of the drawings, the reaction gas nozzle 32, the separation gas nozzle 42, the source gas nozzle 31, the separation gas nozzle 41, and the etching gas nozzles 33 are arranged in this order from a transfer opening 15 (which is described later) at intervals in an anticlockwise fashion (in the rotational direction of the turntable 2). Each of the nozzles 31, 32, 33, 41 and 42 is introduced from an outer peripheral wall of the vacuum chamber 1 into the vacuum chamber through each gas introduction port 31a, 32a, 33a, 41a and 42a (see FIG. 3) that are fixed to an outer surface of the outer peripheral wall of the chamber body 12. Each of the nozzles 31, 32, 33, 41 and 42 is attached to the chamber body 12 so as to extend along a radial direction of the chamber body 12 and in parallel with the surface of the turntable 2.

The source gas nozzle 31 is a source gas supply part that supplies a source gas to the wafer W. In the method for depositing a silicon-containing film according to an embodiment, for example, a silicon-containing gas can be used as the source gas supplied from the source gas nozzle 31. Although a variety of silicon-containing gas can be used, for example, an organic aminosilane gas may be used. For example, a 3DMAS (Tris(dimethylamino)silane) gas may be used as the organic aminosilane gas.

The reaction gas nozzle 32 is a reaction gas supply part that supplies a reaction gas capable of producing a reaction product by reacting with the source gas. Hence, the gas capable of producing the reaction product by reacting with a silicon-containing gas, more specifically, a silicon component contained in the silicon-containing gas, can be used as the reaction gas supplied from the reaction gas nozzle 32. For example, an oxidation gas, a nitriding gas and the like can be used. For example, oxygen gas and/or ozone gas is may be used as the oxidation gas. Ammonia gas can be used, for example, as the nitriding gas. This allows a SiN film to be deposited on the wafer W.

The etching gas nozzle 33 is an etching gas supply part that supplies an etching gas to the wafer W. A gas capable of etching a source component contained in a source gas is used as the etching gas supplied from the etching gas nozzle 33. When the source gas is a silicon-containing gas, a gas that can etch the silicon component is used as the etching gas. For example, chlorine ($Cl_2$) gas is used. Chlorine gas is effective in etching silicon, but is not very effective in etching an insulating film containing silicon such as a silicon oxide film ($SiO_2$) and a silicon nitride film (SiN). Hence, as illustrated by an arrow in FIG. 3, the turntable 2 is rotated in the anticlockwise fashion so that the wafer W passes an area under the source gas nozzle 31, and then passes an area under the etching gas nozzle 33 with the silicon-containing gas adsorbed on the surface thereof. Thus, the wafer W passes an area under the reaction gas nozzle 32 after reducing an amount of the adsorbed silicon component by etching a part of the silicon component contained in the silicon-contained gas. A more specific film deposition method is described later.

The present embodiment is described by citing an example of using the etching gas nozzle 33 as a unit to supply an etching gas, but for example, the film deposition apparatus is configured to supply the etching gas to the wafer W by using a shower head instead of the etching gas nozzle 33. Thus, as long as the etching gas can be supplied to the wafer W, the etching gas nozzle 33 can be replaced by another etching gas supply unit.

A source gas supply source containing the source gas is connected to the source gas nozzle 31 through an open/close valve and a flow controller (both of which are not shown in the drawing). Also, a reaction gas supply source containing the reaction gas is connected to the reaction gas nozzles 32 through an open/close valve and a flow controller (both of which are not shown in the drawing). Similarly, an etching gas supply source is connected to the etching gas nozzle 33 through an open/close valve and a flow controller (both of which are not shown in the drawing).

The silicon-containing gas used as the source gas is not limited to a specific type. In addition to the above-mentioned 3DMAS (Tris(dimethylamino) silane $Si(N(CH_3)_2)_3H$), an aminosilane-based gas such as 4DMAS (Tetrakis(dimethylamino) silane $Si(N(CH_3)_2)_4$), and TCS (tetrachlorosilane $SiCl_4$), DCS (dichlorosilane $SiH_2Cl_2$), $SiH_4$ (monosilane), HCD (hexachlorodisilane $Si_2Cl_6$) or the like can be preferably used.

When an oxidation gas is used as the reaction gas, as described above, oxygen gas and/or ozone gas can be preferably used. In particular, the oxidation gas is preferred to contain ozone gas, which makes it possible to obtain a particularly dense silicon oxide film.

The separation gas nozzles 41 and 42 are connected to a supply source (not illustrated) of an inert gas through an open/close valve and a flow controller (both of which are not illustrated). The inert gas is not limited to a specific type, and as described above, a noble gas, $N_2$ gas are the like can be used. For example, $N_2$ gas may be used as the separation gas. These inert gases are used as so-called a purge gas. Accordingly, the separation gas nozzles 41 and 42 may be referred to as purge gas nozzles.

FIG. 4 is a diagram illustrating an example of a source gas nozzle and a nozzle cover. FIG. 5 is a partial cross-sectional view taken along a line in the circumferential direction of the vacuum chamber 1.

As illustrated in FIGS. 4 and 5, each of the source gas nozzle 31, the reaction gas nozzle 32 and the etching gas nozzle 33 has a plurality of gas discharge holes 37 that opens downward facing the turntable 2 arranged in a lengthwise direction of each of the source gas nozzle 31, the reaction gas nozzle 32 and the etching gas nozzle 33. The arrangement of the gas discharge holes 37 is not limited to a specific arrangement, but for example, the gas discharge holes 37 may be arranged at an interval of 10 mm. In an area below the source gas nozzle 31, there is a first process area P1 used to cause the silicon-containing gas, which is the source gas, to adsorb on the wafer W. An area below the etching gas nozzles 33 and the reaction gas nozzle 32 is a second process area P2. Although the second process area P2 includes the reaction gas nozzle 32 and the etching gas nozzle 33 together, an area below the reaction gas nozzle 32 is a reaction gas supply area, and an area below the etching gas nozzle 33 is an etching gas supply area. Although there is no clear border line between the reaction gas supply area and the etching gas supply area, the etching gas nozzle 33 is arranged at the most upstream location within the second process area P2 in the rotational direction of the turntable 2, and the reaction gas nozzle 32 is arranged at the most downstream location within the second process area P2 in the rotational direction of the turntable 2. In other words, the reaction gas supply area and the etching gas supply area are located at the most distant positions from each other. Thus, as illustrated in FIG. 3, the upstream end portion of the second process area P2 may be made the etching gas supply area P21, and the downstream end portion of the second process area P2 may be made the reaction gas supply area P22.

When depositing a silicon-containing film while etching the silicon-containing gas adsorbed on the wafer W, the turntable 2 is rotated while supplying the silicon-containing gas from the source gas nozzle 31, supplying the reaction gas from the reaction gas nozzle 32, and supplying the separation gas from the separation gas nozzles 41 and 42.

That is, by respectively supplying the source gas and the reaction gas for a film deposition from the source gas nozzle 31 and the reaction gas nozzle 32 and supplying the etching gas from the etching gas nozzle 33 at the same time while rotating the turntable 2 in the anticlockwise direction, both of the film deposition process and the etching process can be performed during a single revolution of the turntable 2. Here, a reason why the turntable 2 is rotated in the anticlockwise direction is because in a film deposition process for depositing a film conformal with a surface shape of the wafer W, it is necessary to cause a thin source gas adsorption layer to react with a reaction gas on the surface of the wafer W by causing the source gas such as the Si-containing gas to adsorb on the wafer W and supplying the reaction gas such as the oxidation gas or the nitriding gas after thinning the adsorbed source gas by etching. To do this, the turntable 2 needs to be rotated so that the source gas, the etching gas and the reaction gas are supplied to the wafer W in this order. By rotating the turntable 2 in the anticlockwise direction, the wafer W passes the area under the reaction gas nozzle 32 after passing the areas under the source gas nozzle 31 and the etching gas nozzle 33 in this order. By doing this, a cycle is repeated in the order of the adsorption, the etching, and the generation of the reaction product (deposition), and a film deposition that does not block an opening of a recessed pattern formed in the surface of the wafer W and implements a bottom-up filling can be achieved.

In the meantime, when performing only a film deposition of a silicon-containing film without etching the silicon-containing film adsorbed on the wafer W, only the film deposition process can be performed in the first and second process areas P1 and P2 by not supplying an etching gas from the etching gas nozzles 33, or supplying a purge gas such as a noble gas or $N_2$ gas from the etching gas nozzles 33, and respectively supplying the silicon-containing gas, the reaction gas, and the separation gas (purge gas) from the source gas nozzle 31, the reaction gas nozzle 32, and the separation gas nozzles 41 and 42 while rotating the turntable 2 in the clockwise fashion or the anticlockwise fashion.

Figure 4A:
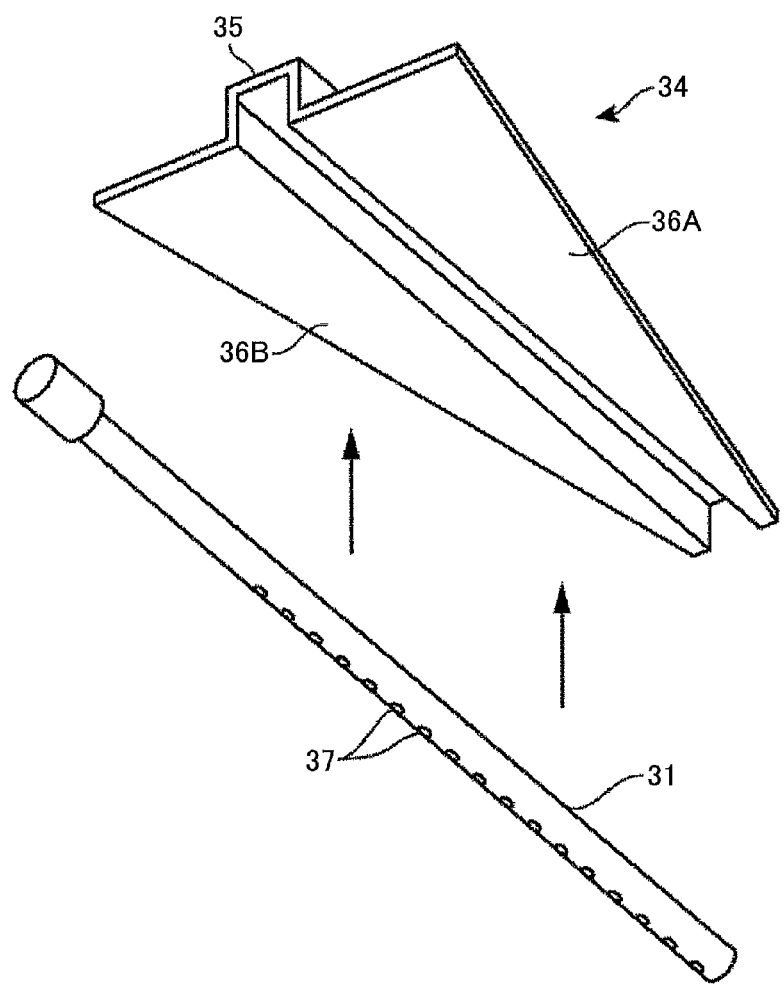
FIGS. 4A and 4B are configuration diagrams illustrating a gas nozzle and a nozzle cover of a film deposition apparatus according to an embodiment of the present invention.
Figure 4B:
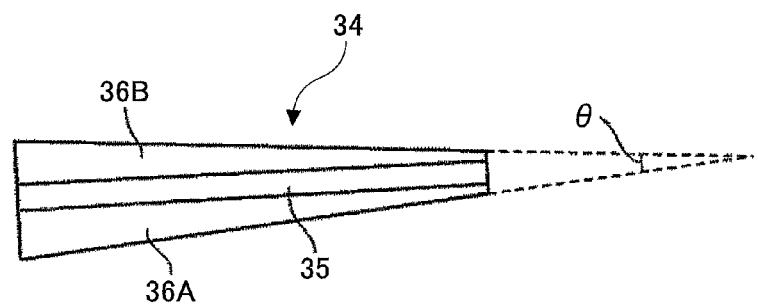
Figure 5:
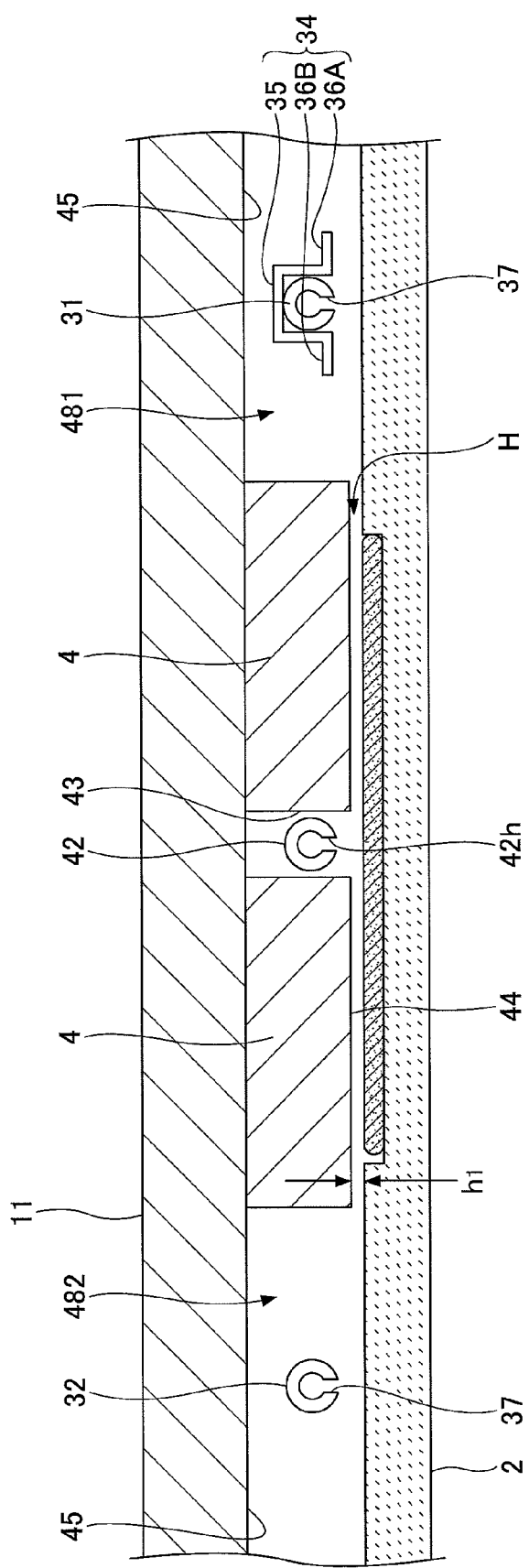
FIG. 5 is a partial cross-sectional view of an example of a film deposition apparatus according to an embodiment of the present invention.

As illustrated in FIGS. 4A and 4B, a nozzle cover 34 is preferably provided at the source gas nozzle 31. The nozzle cover 34 is described below with reference to FIGS. 4A and 43. The nozzle cover 34 extends along the lengthwise direction of the source gas nozzle 31 and has a base part 35 having a convex cross-sectional shape. The base part 35 is arranged to cover the source gas nozzle 31. A current plate 36A is attached to a lower end of one side wall extending along the lengthwise direction of the base part 35 and a current plate 36B is attached to a lower end of the other side wall. In the embodiment, the current plates 36A and 36B are secured parallel to the upper surface of the turntable 2. Moreover, in the embodiment, as illustrated FIGS. 2 and 3, the current plate 36A is arranged on the upstream side of the first gas nozzle in the rotational direction of the turntable 2, and the current plate 36B is arranged on the downstream side.

As clearly illustrated in FIG. 4B, the current plates 36A and 36B are symmetrically formed with respect to the central axis of the source gas nozzle 31. Moreover, a length of the current plates 36A and 36B along the rotational direction of the turntable 2 increases with decreasing distance to the outer periphery of the turntable 2, and therefore, the nozzle cover 34 has an approximately fan-like planar shape. Here, although a central angle θ of the fan illustrated by a dashed line in FIG. 4B is determined by also considering a size of a convex portion 4 (separation area D) described later, for example, the angle is preferred to be in a range from 5 degrees to less than 90 degrees, and more specifically, is further preferred to be in a range from 8 degrees to less than 10 degrees.

Here, in the embodiment, an example of providing the nozzle cover 34 at only at the source gas nozzle 31 is illustrated, but a similar nozzle cover may be provided at the etching gas nozzles 33 and the reaction gas nozzle 32.

Referring to FIGS. 2 and 3, two convex portions 4 are provided inside the vacuum chamber 1. Each of the convex portions 4 has a substantially fan-like shape in its plan view with its apex cut in a circular arc shape. In this embodiment, an inner circular arc is connected to a ring-shaped protruding portion 5 (described later), and an outer circular arc is arranged along an inner peripheral surface of the chamber body 12 of the vacuum chamber 1. FIG. 5 illustrates a cross section of the vacuum chamber 1 along a concentric circle of the turntable 2 from the source gas nozzle 31 to the reaction gas nozzle 32. As illustrated in FIG. 5, the convex portion 4 is attached to the back surface of the ceiling plate 11. Accordingly, the vacuum chamber 1 includes a lower ceiling surface 44 (a first ceiling surface), which is a lower surface of the convex portion 4, and a higher ceiling surface 45 (a second ceiling surface), which is a surface higher than the lower ceiling surface 44 and is positioned on both sides of the lower ceiling surface 44 in a circumferential direction therein.

Furthermore, as illustrated in FIG. 5, a groove portion 43 is formed in the middle of the convex portion 4 in its circumferential direction so as to extend along a radial direction. The separation gas nozzle 42 is accommodated inside the groove portion 43. Another groove portion 43 is similarly formed in another convex portion 4. The separation gas nozzle 41 is accommodated in the other groove portion 43. As illustrated in FIG. 5, gas discharge holes 42h are formed in the separation gas nozzle 42. More specifically, the plurality of gas discharge holes 42h are formed along the lengthwise direction of the separation gas nozzle 42 at a predetermined interval (e.g., 10 mm). Moreover, an opening size of the gas discharge holes 42h can be set at, for example, 0.3 to 1.0 mm. Although not illustrated in the drawing, gas discharge holes 42h can be formed in the separation gas nozzle 41 similarly to the separation gas nozzle 42.

The source gas nozzle 31 and the reaction gas nozzle 32 are provided in spaces under the high ceiling surface 45. The source gas nozzle 31 and the reaction gas nozzle 32 are provided in the vicinity of the wafer W and apart from the ceiling surface 45. In addition, FIG. 5 illustrates a space 481 under the ceiling surface 45 where the source gas nozzle 31 is provided and a space 482 under the ceiling surface 45 where reaction gas nozzle 32 and the etching gas nozzle 33 (not illustrated in FIG. 5) are provided.

A separation space H, which is narrow, is formed between the low ceiling surface 44 and the turntable 2. When an inert gas, for example, $N_2$ gas, is supplied from the separation gas nozzle 42, $N_2$ gas flows toward the spaces 481 and 482 through the separation space H. At this time, because the volume of the separation space H is smaller than the volumes of the spaces 481 and 482, the pressure of the separation space H can be set relatively higher than the pressures in the spaces 481 and 482 by $N_2$ gas. In other words, the separation space H provides a pressurized blocking wall having a high pressure between the spaces 481 and 482. Moreover, $N_2$ gas flowing from the separation space H to the spaces 481 and 482 serves as counter flows against the source gas from the first process area P1 and the reaction gas and the etching gas from the second process area P2. Accordingly, the source gas from the first process area P1 is separated from the reaction gas and the etching gas from the second process area P2 by the separation space H. Therefore, it is possible to prevent the source from the first process area P1 and the reaction gas and the etching gas from the second process area P2 from mixing and reacting with each other inside the vacuum chamber 1.

Here, it is preferable to set the height h1 of the ceiling surface 44 relative to the upper surface of the turntable 2 suitable to make the pressure in the separation space H higher than the pressures in the spaces 481 and 482, while considering the pressure inside the vacuum chamber 1 during the substrate process, the rotational speed of the turntable 2, the supply amount of the separation gas (the $N_2$ gas), or the like.

Thus, because the separation area D forming the separation space H can be said to be an area for supplying a purge gas to the wafer W, the separation area D can be referred to as a purge gas supply area D.

With reference to FIGS. 1 through 3 again, a ring-shaped protruding portion 5 surrounding the outer periphery of the core portion 21 holding the turntable 2, is provided under the lower surface of the ceiling plate 11. The ring-shaped protruding portion 5 is continuously formed from the convex portions 4 at portions on a side of the rotational center of the convex portions 4. The lower surface of the ring-shaped protruding portion 5 is formed to have substantially the same height as the lower surface of the ceiling surface 44.

Figure 6:
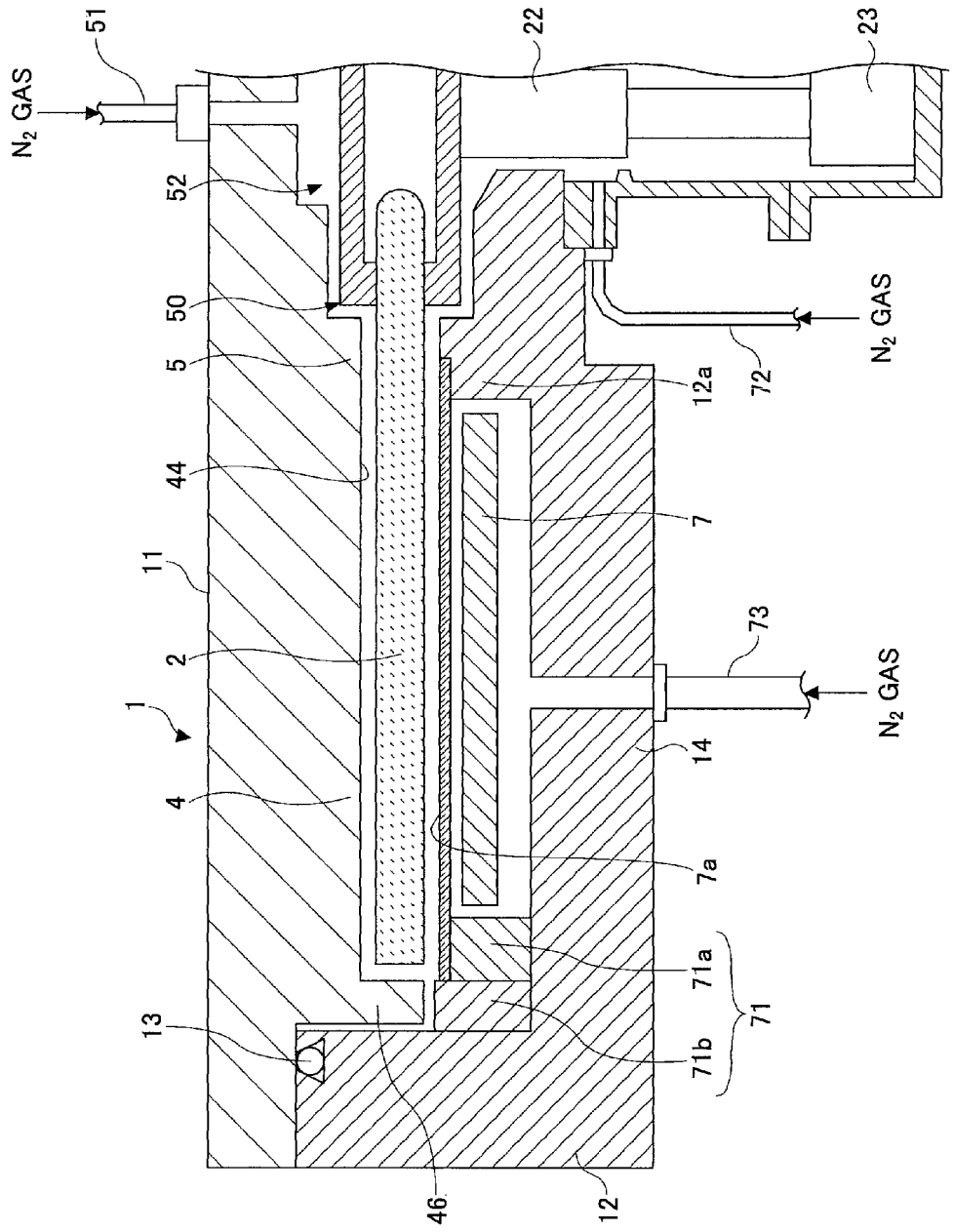
FIG. 6 is another partial cross-sectional view of an example of a film deposition apparatus according to an embodiment of the present invention.

FIG. 1 formerly referred to is a cross-sectional view taken along a line I-I' of FIG. 3, and illustrates an area where the ceiling surface 45 is provided. On the other hand, FIG. 6 is a partial cross-sectional view illustrating an area including the ceiling surface 44 of the film deposition apparatus. As illustrated in FIG. 6, a bent portion 46 bent in a L-like shape so as to face the outer edge surface of the turntable 2 can be formed in a peripheral edge portion (a portion of the vacuum chamber 1 on the outer edge side) of the convex portion 4 shaped into a substantially fan-like shape. The bent portion 46 can prevent gases from circulating between the spaces 481 and 482 (see FIG. 5) through a space between the turntable 2 and the inner periphery of the chamber body 12. The convex portion 4 shaped into the substantially fan-like shape is provided on the ceiling plate 11. Because the ceiling plate 11 is detachable from the chamber body 12, there is a small clearance between the outer peripheral surface of the bent portion 46 and the chamber body 12. A clearance between the inner peripheral surface of the bent portion 46 and the outer edge surface of the turntable 2 and a clearance between the outer peripheral surface of the bent portion 46 and the chamber body 12 are set to have a dimension similar to, for example, a height of the ceiling surface 44 relative to the upper surface of the turntable 2.

Referring to FIG. 3 again, a first evacuation opening 610 in communication with the space 481 and a second evacuation opening 620 in communication with the space 482 are formed between the turntable 2 and the inner periphery of the chamber body 12. As illustrated in FIG. 1, the first and second evacuation openings 610 and 620 are connected to, for example, a vacuum pump 640 that is an evacuating unit, through exhaust pipes 630. FIG. 1 also illustrates a pressure control unit 650 provided in the exhaust pipe 630.

As illustrated in FIGS. 1 and 6, a heater unit 7 that is a heating means can be provided in a space between the turntable 2 and the bottom part 14 of the chamber 1, thereby heating the wafer W on the turntable 2 up to a temperature determined in a process recipe through the turntable 2. A ring-shaped cover member 71 is provided around the periphery and on the lower side of the turntable 2 to prevent the gas from intruding into a lower area under the turntable 2. As illustrated in FIG. 6, the cover member 71 can be configured to include an inner member 71a provided in a position vertically corresponding to the outer edge portion of the turntable 2 and to an outer peripheral side outside the outer edge portion of the turntable 2, and an outer member 71b provided between the inner member 71a and the inner wall surface of the vacuum chamber 1. The outer member 71b is provided in the vicinity of the bent portion 46 formed on the outer edge portion of the convex portion 4 in the separation areas D under the bent portions 46. The inner member 71a surrounds the entire periphery of the heater unit 7 and is positioned under the outer edge portion of the turntable 2 and a portion slightly outside the outer edge portion.

As illustrated in FIG. 1, a part of the bottom part 14 closer to the rotation center than the space where the heater unit 7 is arranged has the ring-shaped protruding portion 12a protruding upward so as to approach the core portion 21 that is provided on the lower surface of the turntable 2 and at and around the center portion of the turntable 2. A narrow space is provided between the ring-shaped protruding portion 12a and the core portion 21. A clearance between the inner peripheral surface of a through-hole provided for the rotational shaft 22 that penetrates through the bottom part 14 and the rotational shaft 22 is small. The narrow space and the small clearance are in communication with the inside of the case body 20. A purge gas supply pipe 72 is provided in the case body 20 so that $N_2$ gas that is the purge gas is supplied into the narrow space to purge the narrow space. In the bottom part 14 of the vacuum chamber 1, a plurality of purge gas supply pipes 73 are provided under the heater unit 7 at intervals of a predetermined angle in the circumferential direction (only one purge gas supply pipe 73 is illustrated in FIG. 6) to purge a space where the heater unit 7 is arranged. Furthermore, a lid member 7a is provided between the heater unit 7 and the turntable 2 to bridge and cover a clearance between the inner peripheral wall of the outer member 71b (the upper surface of the inner member 71a) and the upper end portion of the ring-shaped protruding portion 12a along the circumferential direction in order to prevent the gas from intruding into an area in which the heater unit 7 is provided. The lid member 7a can be made of, for example, quartz.

When $N_2$ gas is supplied from the purge gas supply pipe 72, $N_2$ gas flows through a space between the turntable 2 and the lid member 7a by way of a clearance between the inner periphery of the through-hole and the rotational shaft 22 and a clearance between the protruding portion 12a and the core portion 21, and is evacuated from the first evacuation opening 610 or the second evacuation opening 620 (see FIG. 3). Moreover, when $N_2$ gas is supplied from the purge gas supply pipes 73, $N_2$ gas flows out of the space in which the heater unit 7 is accommodated through a clearance between the lid member 7a and the inner member 71a (not illustrated in the drawing), and is evacuated from the first evacuation opening 610 or the second evacuation opening 620 (see FIG. 3). The flow of $N_2$ gas can prevent the gases in the space 481 and the space 482 mixing with each other through a space on the central and lower side of the vacuum chamber 1 and a space below the turntable 2.

Moreover, a separation gas supply tube 51 is connected to a center portion of the ceiling plate 11 of the vacuum chamber 1 so as to supply the separation gas of $N_2$ gas to a space 52 between the ceiling plate 11 and the core portion 21. The separation gas supplied to the space 52 is discharged toward the periphery of the turntable 2 along the surface on the side of a wafer receiving area (circular concave portion 24) of the turntable 2 through a narrow clearance 50 (see FIG. 6) between the ring-shaped protruding portion 5 and the turntable 2. The space 50 is maintained to have a pressure higher than the pressures of the spaces 481 and 482 by the separation gas. Therefore, the space 50 prevents the source gas supplied to the first process area P1 and the etching gas and the reaction gas supplied to the second process area P2 from being mixed with each other after passing through the center area C. That is to say, the space 50 (or the center area C) functions in a manner similar to the separation space H (or the separation area D).

Furthermore, as illustrated in FIGS. 2 and 3, a transfer opening 15 can be formed in the side wall of the vacuum chamber 1 for transferring the wafer W, which is the substrate, between a transfer arm 10 provided outside the vacuum chamber 1 and the turntable 2. The transfer opening 15 is opened and closed by a gate valve (not illustrated in the drawing). In this case, the wafer W is transferred between the circular concave portion 24 that is the wafer receiving area of the turntable 2 and the transfer arm 10 when the circular concave portion 24 is located at a position facing the transfer opening 15. For this purpose, lift pins (not illustrated in the drawing) for lifting the wafer W from the back surface side to serve and receive the wafer W and a lifting mechanism (not illustrated in the drawing) for lifting the lift pins (not illustrated in the drawing) can be provided at a portion of the turntable 2 corresponding to the position where the wafer W is served and received. The lift pins penetrate through the circular concave portion 24 of the turntable 2.

Moreover, as illustrated in FIG. 1, the film deposition apparatus according to the embodiment may include a control unit 100 constituted of a computer for controlling operations of the entire film deposition apparatus. A program to be executed by the film deposition apparatus under control of the control unit 100 can be stored in a memory of the control unit 100. This program includes groups of steps for performing the method for depositing the film as described below and is stored in a medium 102 such as a hard disk, a compact disk, a magnetic optical disk, a memory card, a flexible disk, or the like. The program is read in a memory unit 101 by a predetermined reading device and can be installed inside the control unit 100.

[Method for Depositing Silicon-Containing Film]

Next, a method for depositing a silicon-containing film according to an embodiment of the present invention is described below. Although the method for depositing the silicon-containing film according to the embodiment can be performed by a film deposition apparatus other than the above-described film deposition apparatus, for convenience of explanation, an example of performing the method by using the above-described film deposition apparatus is described below.

FIGS. 7A through 7E are diagrams illustrating an example of a series of processes of the method for depositing the silicon-containing film according to an embodiment of the present invention. The embodiment is described by citing an example in which a substrate on which a film is deposited is a silicon wafer W and a type of film to be deposited is a silicon oxide film.

FIG. 7A is a diagram illustrating an example of a substrate preparation process. In the substrate preparation process, a wafer W on which a film is to be deposited is prepared. FIG. 7A also illustrates an example of a depression 80 formed in a surface of the wafer W. The depression 80 is an object to be filled with the silicon-containing film. The depression 80 is formed as a part of an interconnection pattern of the wafer W, and may include a trench with a groove shape, and a via with a hole shape. The aspect ratio of the depression 80, which is the ratio of a width to a depth of the depression 80, may include an aspect ratio from a low aspect ratio of about 1:10 to a high aspect ratio of hundreds such as 1:100 and 1:200.

When using the film deposition apparatus of the embodiment, in the substrate preparation process, the prepared wafer W is placed on the circular concave portion 23 of the turntable 2 in the vacuum chamber 1. More specifically, to begin with, as illustrated in FIGS. 2 and 3, a gate valve (not illustrated in the drawing) is opened, and the wafer W is transferred into the circular concave portion 24 of the turntable 2 through the transfer opening 15 from the outside by the transfer arm 10. The transfer of the wafer W is performed by causing the lift pins (not illustrated) to move up and down from the bottom side of the vacuum chamber 1 through the through-holes formed in the bottom surface of the circular concave portion 24 when the circular concave portion 24 stops at a position facing the transfer opening 15. Such transfer of the wafer W is performed by intermittently rotating the turntable 2, and the wafers W are placed on five of the circular concave portions 24 of the turntable 2, respectively. The depression 80 as illustrated in FIG. 7A is formed in the surface of each of the wafers W.

Subsequently, the gate valve is closed, and after the vacuum pump 640 evacuates the vacuum chamber 1 up to a predetermined reachable degree of vacuum and while continuing to evacuate the vacuum chamber 1, $N_2$ gas of the separation gas is discharged at a predetermined flow rate from the separation gas nozzles 41 and 42. Moreover, $N_2$ gas is also discharged from the separation gas supply pipe 51 and the purge gas supply pipes 72 and 73 at a predetermined flow rate. Following this, the pressure control unit 650 (see FIG. 1) adjusts the pressure in the vacuum chamber 1 to a preset process pressure. Next, the wafer W is heated up to a temperature of, for example, 550 degrees C. by the heater unit 7 while rotating the turntable 2 in an anticlockwise direction at a rotational speed of, for example, 60 rpm.

FIG. 7B is a diagram illustrating an example of an underlying silicon oxide film deposition process. In the underlying silicon oxide film deposition process, a silicon oxide film 90 that serves as an underlying layer is deposited on the surface of the wafer W by ALD (Atomic Layer Deposition). Because the method for depositing the silicon-containing film according to the embodiment includes a process of etching silicon, when an underlayer is silicon before filling the depression 80 with a silicon oxide film, the underlayer is etched if a thin silicon oxide film ($SiO_2$) is not deposited on the depression 80 as the underlayer. Hence, by performing the pretreatment of coating the depression 80 with the silicon oxide film, a protective film is formed on the surface of the depression 80 so as not to etch the surface of the depression 80 by an etching process.

More specifically, a process of depositing the silicon oxide film is performed. In the film deposition process, a silicon-containing gas is supplied from the source gas nozzle 31, and an oxide gas is supplied from the reaction gas nozzle 32. The etching gas nozzle 33 supplies $N_2$ gas as a purge gas, or does not supply any gas. Although a variety of gases is available for the silicon-containing gas, an example of using 3DMAS gas that is a type of organic aminosilane gases is described below. Also, although a variety of gases is available for the oxidation gas, an example of using ozone gas is described below.

Figure 8A:
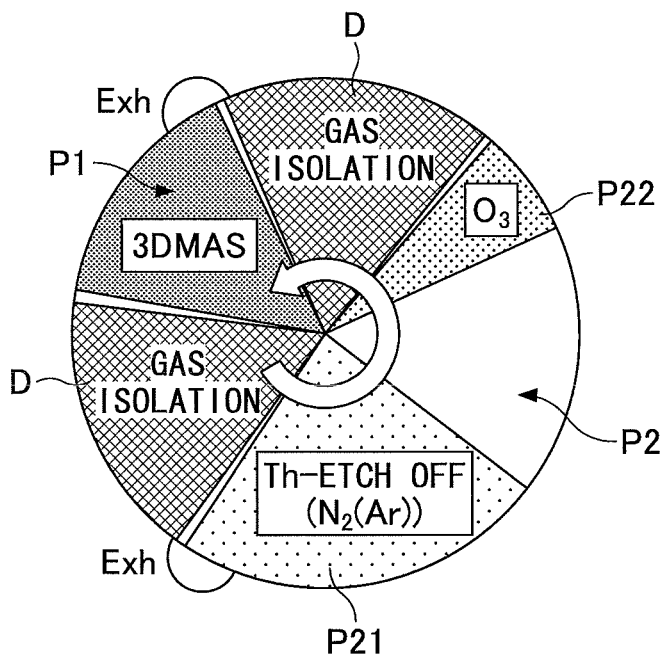
FIGS. 8A and 8B are diagrams for explaining a gas supply state and rotation of a turntable in an underlying silicon oxide film deposition process.
Figure 8B:
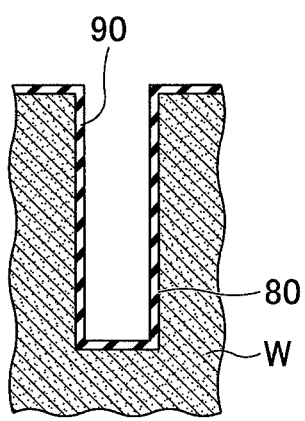

FIGS. 8A and 8B are diagrams for explaining an example of a gas supply state and a rotational state of the turntable 2 in the underlying silicon oxide film deposition process. FIG. 8A is a diagram illustrating the example of the gas supply state and the rotational state of the turntable 2 in the underlying silicon oxide film deposition process, and FIG. 8B is a diagram illustrating an example of a depression filling state in the underlying silicon oxide film deposition process. Here, FIG. 8B is similar to FIG. 7B.

As illustrated in FIG. 8A, when the wafer W passes through the first process area P1, 3DMAS that is the source gas is supplied from the source gas nozzle 31 and adsorbs on the surface of the wafer W. The wafer W on which 3DMAS is adsorbed passes through the separation area D by rotation of the turntable 2 and is purged there, and then enters the second process area P2. In the second process area P2, because an etching gas is not supplied from the etching gas nozzle 33 in the etching gas supply area P21, the wafer W reaches the reaction gas supply area P22 while no chemical reaction (etching reaction) is generated on the wafer W. Here, the etching gas nozzle 33 does not supply any gas, or supplies $N_2$ gas that is the purge gas or Ar gas that is a noble gas. In the reaction gas supply area P22, ozone gas is supplied from the reaction gas nozzle 32, and the silicon component contained in 3DMAS is oxidized by ozone gas, thereby depositing $SiO_2$ that is a reaction product on the surface of the wafer W (see FIG. 8B). The wafer W having passed the second process area P2 enters the first process area P1 after being purged while passing through the separation area D including the separation gas nozzle 41. In the first process are P1, 3DMAS is supplied from the source gas nozzle 31 again, and 3DMAS adsorbs on the surface of the wafer W. By repeating a similar cycle in the following steps, as illustrated in FIG. 8B, $SiO_2$ that is the reaction product is deposited on the surface of the wafer W, and an underlying $SiO_2$ film is deposited. Here, Although FIG. 8A illustrates an example of rotating the turntable 2 in the anticlockwise fashion, the rotational direction of the turntable 2 may be a clockwise direction opposite to the example of FIG. 8A in the underlying silicon oxide film deposition process. Even in this case, because the wafer W repeats a film deposition cycle in which the wafer W alternately passes the first process area P1 and the second process area P2, the underlying film deposition process can be performed by rotating the turntable 2 in any rotational direction. However, because the turntable 2 needs to be rotated in the anticlockwise fashion in the following combined deposition and etching process, the turntable 2 is preferably set to be rotated in the same direction as the next process while considering smoothly connecting to the next process.

The underlying $SiO_2$ film only needs to have a minimum film thickness to be able to prevent the silicon surface of the depression 80 from being etched. For example, the underlying $SiO_2$ film may have a thickness of about 2 nm. A series of film deposition cycle composed of supplying the silicon-containing gas to the wafer, supplying the purge gas, supplying the oxidation gas, and supplying the purge gas, is repeated until the underlying $SiO_2$ film having a predetermined film thickness is deposited.

FIG. 7C is a diagram illustrating an example of an initial stage of a combined deposition and etching process, and FIG. 7D is a diagram illustrating an example of a middle state of the combined deposition and etching process. In the combined deposition and etching process, each of the film deposition and the etching is performed one time during one rotation of the turntable 2. As illustrated in FIGS. 7C and 7D, in the combined deposition and etching process, an overhang by the film deposition is prevented so as not to block the opening at the upper end of the depression 80, and a conformal film deposition taken along with the shape of the depression 80 is performed with bottom up filling.

Figure 9A:
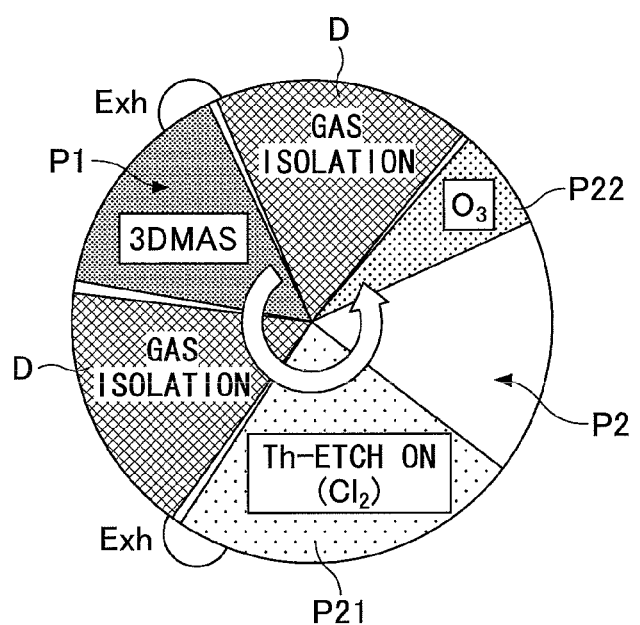
FIGS. 9A through 9C are diagrams for explaining a gas supply state and rotation of a turntable in a film deposition process along with an etching.
Figure 9B:
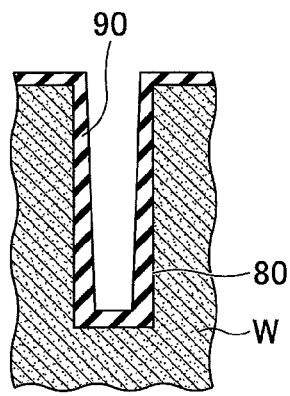
Figure 9C:
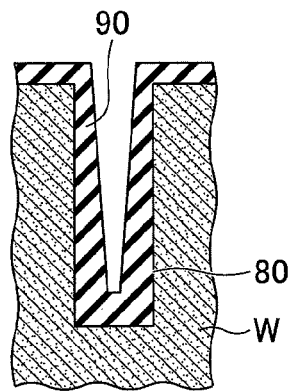

FIGS. 9A through 9C are diagrams for explaining an example of a gas supply state and a rotational state of the turntable 2 in the combined deposition and etching process. FIG. 9A is a diagram illustrating the example of the gas supply state and the rotational state of the turntable 2 in the combined deposition and etching process. FIG. 9B is a diagram illustrating an example of a depression filling state in a first half of the combined deposition and etching process. FIG. 9C is a diagram illustrating an example of the depression filling state in a second half of the combined deposition and etching process. Here, FIG. 9B is similar to FIG. 7C, and FIG. 9C is similar to FIG. 7D.

As illustrated in FIG. 9A, in the combined deposition and etching process, chlorine gas that is an etching gas is supplied from the etching gas nozzle 33 in the etching gas supply area P21 (see FIGS. 2 and 3) while continuously supplying 3DMAS from the source gas nozzle 31 in the first process area (see FIGS. 2 and 3) and continuously supplying ozone gas from the reaction gas nozzle 32 (see FIGS. 2 and 3) from the underlying silicon oxide film deposition process. By starting the supply of the etching gas, the silicon component of 3DMAS gas adsorbed on the surface of the wafer W including the depression 80 in the first process area P1 is partially etched in the etching gas supply area P21, and a smaller amount of silicon component than the adsorbed silicon component remains on the surface of the wafer W while continuing to adsorb thereon. The wafer W having passed through the etching gas supply area P21 reaches the reaction gas area P22, in which ozone gas is supplied to the wafer W. Hence, the remaining silicon component adsorbed in the depression 80 is oxidized by ozone gas, and a silicon oxide film is produced as a reaction product and is deposited in the depression 80. Here, only a very small amount of silicon oxide film is deposited because the partial silicon component has been already etched, and a conformal film deposition can be performed (see FIG. 9B). Moreover, because the etching gas is significantly supplied to the opening at the upper end of the depression 80 and its neighborhood and because an amount of etching gas reaching the bottom of the depression 80 is smaller than that of the upper end of the depression 80 and its neighborhood, an amount of etching of the silicon component is greater at the opening at the upper end of the depression 80 and its neighborhood than at the bottom of the depression 80. In other words, the film deposition can be continued while forming a V-shaped silicon oxide film 90. Accordingly, the silicon oxide film is naturally deposited from the bottom in sequence, and the bottom up filling can be performed. Here, the turntable 2 is set at a temperature appropriate for a thermal etching. For example, the turntable 2 is set at a temperature in a range from 400 to 650 degrees C., and preferably, set at about 550 degrees C. (see FIG. 9C). Furthermore, because chlorine gas has a strong etching effect on silicon, chlorine gas only needs to be supplied to the wafer W at a very low flow rate. For example, chlorine gas only needs to be supplied to the wafer W in a range of 10 to 300 sccm, or preferably in a range of 50 to 200 sccm, or further preferably at about 100 sccm.

FIG. 7E is a diagram illustrating a state of the depression 80 having been filled with the silicon oxide film 90. As illustrated in FIGS. 7C through 7E, the depression 80 is gradually filled with the silicon oxide film 90 while preventing a void from occurring in the silicon oxide film 90 by repeating the combined deposition and etching cycle that is performed by rotating the turntable 2 one time per rotation required number of times. The number of times to repeat the etching process and the film deposition process can be set at an appropriate number depending on a shape of a depressed pattern such as the depression 80 including the aspect ratio. When the aspect ratio is high, the number of repetitions becomes great.

After the underlying silicon oxide film deposition process as illustrated in FIGS. 7B, 8A and 8B, the combined deposition and etching cycle as illustrated FIGS. 7C through 7E and 9A through 0C is repeated. Finally, as illustrated in FIG. 7E, the depression 80 is completely filled with the silicon oxide film 90.

As illustrated in FIGS. 7C through 7C, in the combined deposition and etching process, a new silicon oxide film is further deposited on the silicon oxide film 90 etched into the V shape in the etching process, and the film thickness increases. Because the new silicon oxide film is deposited on the silicon oxide film 90 etched into the V shape, the entrance is not closed in depositing the film, and the film can be deposited from the bottom of the silicon oxide film 90. Thus, defects such as voids or seams can be prevented from occurring in the silicon oxide film 90 with which the depression 80 is filled.

FIGS. 7A through 7E have illustrated an example of performing the film deposition by cyclically repeating only the combined deposition and etching cycle after the underlying silicon oxide film deposition process in which the etching gas is not supplied. However, after the underlying silicon oxide film deposition process, the combined deposition and etching cycle may be periodically performed like the combined deposition and etching cycle is performed one time after the silicon oxide film deposition cycle is repeated a predetermined number of times without supplying the etching gas to deposit a silicon oxide film 90a as part of the silicon oxide film 90, and the combined deposition and etching cycle is performed one time again after the silicon oxide film deposition cycle is repeated the predetermined number of times without supplying the etching gas again. In other words, in the film deposition process after the underlying silicon oxide film deposition process, a method may be adopted of repeating a film deposition sequence of performing the combined deposition and etching cycle one time every time the film deposition cycle without the etching is performed a predetermined number of times until the depression 80 is filled with the silicon oxide film 90 and the film deposition is performed up to a predetermined film thickness. For example, when the effect of etching is slightly too strong, by adopting such a film deposition sequence of inserting the combined deposition and etching cycle once every predetermined number of repetitions of the film deposition cycle, the effect of etching can be reduced and the film deposition can be performed at appropriate etching intensity. The number of film deposition cycles without performing the etching in one film deposition sequence (film deposition cycle) may be set in a range of, for example, 1 to 10 times, or preferably in a rage of 1 to 5 times.

After performing the film deposition process using the combined deposition and etching cycle, the wafer W on which the film is deposited is carried out of the vacuum chamber 1 in a procedure opposite to the procedure for carrying the wafer W into the vacuum chamber 1. More specifically, the turntable 2 is stopped at a position where the wafer W to be carried out faces the transfer opening 15; the wafer W is pushed up by the lift pins (not illustrated in the drawings); and the transfer arm 10 holds the wafer W from the outside of the vacuum chamber 1 and carries the wafer W out of the vacuum chamber 1. This procedure is performed for all of the wafers W placed on the concave portions 24 formed in the surface of the turntable 2 by intermittently rotating the turntable 2, and all of the wafers W are carried out of the vacuum chamber 1.

FIGS. 10A through 10D are diagrams for explaining a chemical reaction occurring in the combined deposition and etching cycle of the method for depositing the silicon-oxide film according to the embodiment of the present invention.

FIG. 10A is a diagram illustrating an example of an initial oxidation state of the depression 80. The surface of the silicon wafer W including the depression 80 is oxidized, and a hydroxyl (OH) group is present on the surface. In this state, in the combined deposition and etching cycle, 3DMAS that is the source gas is supplied.

FIG. 10B is a diagram illustrating an example of a state of 3DMAS adsorbed on the surface of the wafer W including the depression 80. Thus, a molecular layer 91 of 3DMAS containing silicon component is formed on the surface of the wafer W including the depression 80.

FIG. 10C is a diagram illustrating an example of a state of the surface of the wafer W including the depression 80 after being etched. In the etching process, chlorine gas is supplied to the wafer W as an etching gas, in which the etching gas is sufficiently supplied to the surface of the wafer W and an upper part of the depression 80 and the silicon component is removed by the etching. In contrast, in the bottom part of the depression 80 to which the etching gas is difficult to get, a significant amount of adsorbed 3DMAS remains without being etched. Thus, a V-shaped adsorbed layer 92 of 3DMAS is formed in the depression 80.

FIG. 10D is a diagram illustrating an example of a state of the surface of the wafer W including the depression 80 after being oxidized. When an oxidation gas such as ozone gas us supplied to the wafer W, the surface including the depression 80 is oxidized. In an area around the bottom part of the depression 80 on which 3DMAS remains and adsorbs, the silicon component and ozone gas react with each other, and the silicon oxide film 90 that is the reaction product is deposited. In contrast, hydroxyl groups are formed on the upper part of the depression 80 and the surface of the wafer W from which the silicon component have been removed by the etching.

By repeating the combined deposition and etching cycle of FIGS. 10A through 10D, the silicon oxide film 90 is gradually deposited upward from the bottom surface of the depression 80, and the depression 80 is gradually being filled with the silicon oxide film 90.

In this manner, according to the method for depositing the silicon-containing film of the embodiment, the film deposition for filling the depression 80 can be performed by preferable bottom up filling from the bottom part of the depression 80 without using plasma. Thus, the film deposition for filling the depression 80 with the silicon oxide film without or with few defects such as voids or seams can be achieved while downsizing the film deposition apparatus.

The control unit 100 described with reference to FIG. 1 controls the rotation of the turntable 2, the temperature in the vacuum chamber 1, the timing and flow rates of the gases supplied from the gas nozzles 31 through 33, 41 and 42, and the like so as to implement the method for depositing the silicon-containing film according to the embodiment. These control contents are recorded in the recording medium 102 as a program, and the control may be performed by installing the program, as discussed above.

The method for depositing the silicon-containing film according to the embodiment is not necessarily performed by the film deposition apparatus described in FIGS. 1 through 6 as long as the process described with reference to FIGS. 7A through 10D can be implemented. As long as the film deposition by ALD and the etching process can be performed in a single process chamber, a variety of film deposition apparatuses can perform the method for depositing the silicon-containing film according to the embodiment.

In addition, by changing the oxidation gas into a nitriding gas such as $NH_3$ and the like, a silicon nitride film can be deposited in a similar procedure.

[Working Example]

Next, working examples implementing the method and apparatus for depositing the silicon-containing film according to the embodiment of the present invention are described below.

In the method for depositing the silicon-containing film according to the working examples of the present invention, the method for depositing the silicon-containing film described with reference to FIGS. 7A through 10D was performed by using the film deposition apparatus having a similar configuration to the film deposition apparatus described with reference to FIGS. 1 through 6. Here, a shower head was used instead of the etching gas nozzle 33 in the film deposition apparatus used in the working examples.

With respect to specific process conditions, in a method for depositing a silicon-containing film without an etching according to a comparative example, a temperature of the wafer W was set at 550 degrees C.; a pressure in the vacuum chamber 1 was set at 1.8 Torr; and a rotational speed of the turntable 2 was set at 60 rpm. 3DMAS was supplied to the wafer W with a carrier gas of $N_2$ as a silicon-containing gas. Ozone gas was used as an oxidation gas. 3DMAS had a concentration of 300 $g/Nm^3$, and a flow rate of 200 sccm. A flow rate of the carrier $N_2$ gas was set at 350 sccm, and a flow rate of ozone gas was set at 6000 sccm.

Even in the method for depositing silicon-containing film according to the working examples, the temperature of the wafer W was set at 550 degrees C.; the pressure in the vacuum chamber 1 was set at 1.8 Torr; and the rotational speed of the turntable 2 was set at 60 rpm. The flow rates of the source gas and the reaction gas for film deposition were the same as those of the comparative example. 3DMAS with a concentration of 300 $g/Nm^3$ was supplied at a flow rate of 200 sccm. The carrier gas of $N_2$ was supplied at a flow rate of 350 sccm, and ozone gas was supplied at a flow rate of 6000 sccm. With respect to the etching conditions, a mixed gas of argon (Ar) gas, a carrier Ar gas, and chlorine ($Cl_2$) gas was used as an etching gas. The flow rate of Ar was 2000 sccm, and the flow rate of the carrier Ar gas was 1000 sccm. Although the flow rate of $Cl_2$ was 100 sccm, the flow rate of $Cl_2$ was changed into a variety of values in the following working examples.

FIGS. 11A through 11E are diagrams showing experimental results of the working examples according of the present invention. A via having an opening diameter of 80 to 90 nm, a depth of about 3 micrometers, and an aspect ratio of 37 formed in a silicon wafer W was filled with a silicon oxide film. In FIGS. 11A through 11E, the top end part of the via was called a TOP; a part that is slightly lower than the TOP was called a T-SIDE; a part lower than the TOP by 1 micrometer was called a 1 micrometer; and a part that is lower than the TOP by 2 micrometers was called 2 micrometers, and a part lower than the TOP by 3 micrometers was called 3 micrometers.

FIG. 11A is a diagram showing an initial state of the method for depositing the silicon-containing film according to the comparative example. In the comparative example of FIG. 11A, only a film deposition process was performed without an etching. According to the result, at the location of TOP, the film thickness of the silicon oxide film was 27 nm. At the location of T-SIDE, the film thickness of the silicon oxide film was 28 nm. At the locations of 1-3 micrometers, the film thickness values of the silicon oxide film were respectively 27 nm. As schematically shown in FIG. 11A, it should be noted that the film was deposited with approximately the same film thickness from the location of TOP to the location of 3 micrometers.

FIG. 11B shows an experimental result of the method for depositing the silicon-containing film according to a working example 1 of the present invention. In the method for depositing the silicon-containing film according to the working example 1, the combined deposition and etching process was performed while setting the flow rate of $Cl_2$ at 100 sccm. In the working example 1, the film thickness was 16 nm at the location of TOP, 17 nm at the location of T-SIDE, 21 nm at the location of 1 micrometer depth, 22 nm at the location of 2 micrometer depth, and 21 nm at the location of 3 micrometer depth. As schematically shown in FIG. 11B, it should be noted that the film thickness was slightly thin at TOP and T-Side and that a slightly V-shaped cross section was formed.

FIG. 11C shows an experimental result of the method for depositing the silicon-containing film according to a working example 2. In the method for depositing the silicon-containing film according to the working example 2, the combined deposition and etching process was performed while setting the flow rate of $Cl_2$ at 200 sccm. In the working example 2, the result of the film thickness was 8 nm at the location of TOP, 8 nm at the location of T-SIDE, 17 nm at the location of 1 micrometer depth, 19 nm at the location of 2 micrometer depth, and 18 nm at the location of 3 micrometer depth. As schematically shown in FIG. 11C, the film thickness was thin at TOP and T-SIDE, and it should be clearly noted that a V-shaped cross section was formed.

FIG. 11D shows an experimental result of the method for depositing the silicon-containing film according to a working example 3 of the present invention. In the working example 3, the combined deposition and etching process was performed while setting the flow rate of $Cl_2$ at 300 sccm. In the working example 3, the result of the film thickness was 6 nm at the location of TOP, 9 nm at the location of T-SIDE, 15 nm at the location of 1 micrometer depth, 17 nm at the location of 2 micrometer depth, and 18 nm at the location of 3 micrometer depth. As schematically shown in FIG. 11D, the film thickness was thin at TOP and T-SIDE, and it should be noted that a V-shaped cross section with a larger opening angle was formed.

FIG. 11E shows an experimental result of the method for depositing the silicon-containing film according to a working example 4 of the present invention. In the method for depositing the silicon-containing film according to the working example 4, the combined deposition and etching process was performed while setting the flow rate of $Cl_2$ at 400 sccm. In the working example 4, the result of the film thickness was 5 nm at the location of TOP, also 5 nm at the location of T-SIDE, 13 nm at the location of 1 micrometer depth, 14 nm at the location of 2 micrometer depth, and 17 nm at the location of 3 micrometer depth. As schematically shown in FIG. 11E, it should be clearly noted that a V-shaped cross section was clearly formed from the top end to the bottom part throughout the inside of the via hole.

Figure 12A:
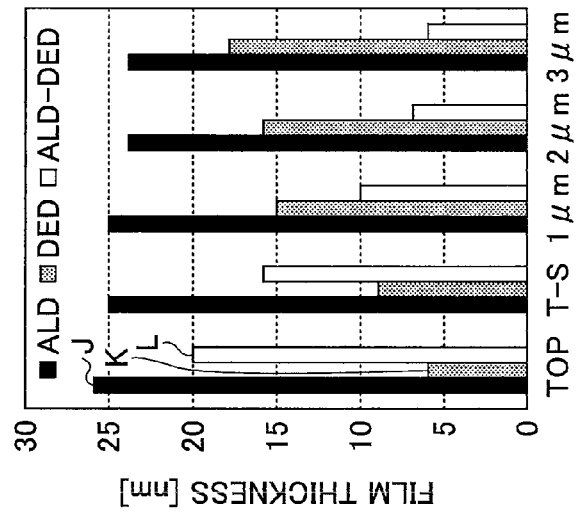
FIGS. 12A through 12C are diagrams graphically showing results of working examples 1 through 3.
Figure 12B:
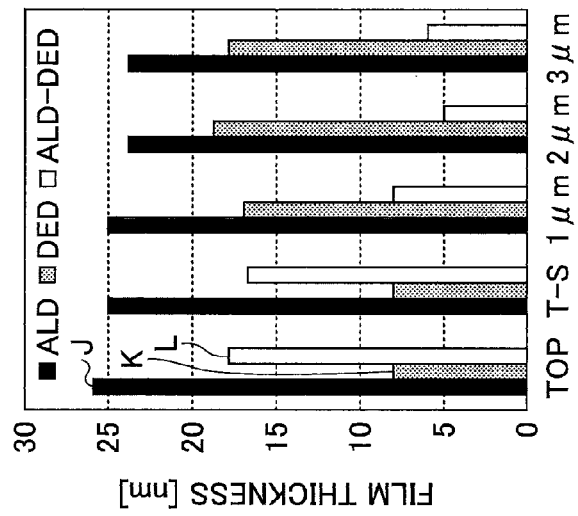
Figure 12C:
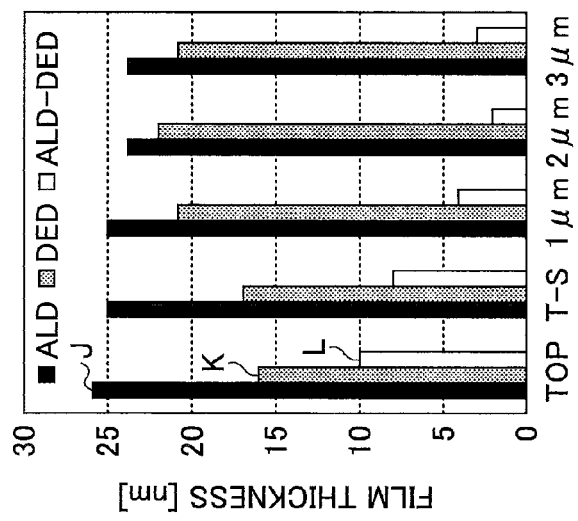

FIGS. 12A through 12C are diagrams graphically showing the results of the working examples 1 through 3. In FIGS. 12A through 12C, the horizontal axis shows a depth location in the via, and the vertical axis shows a film thickness (nm). Moreover, the film thickness values of the silicon oxide film deposited by the film deposition process without the etching according to the comparative example were shown by J. The film thickness values of the silicon oxide film deposited by the combined deposition and etching process according to the working examples were shown by K. Amounts of etching L calculated by subtracting values of the film thickness values K from values of the film thickness values J are shown by L.

FIG. 12A is a graph showing the result of the working example 1 having an etching gas at a flow rate of 100 sccm. FIG. 12A indicates that although the film thickness values J in the film deposition process without the etching is constant at about 25 nm even when the depth location varies, that the film thickness values K in the combined deposition and etching process decreases toward the upper part of the via and that a diameter of the opening increases toward the upper part, which forms a V-shaped cross section as a whole. Moreover, the amounts of etching L that are differences between the film thickness values J and the film thickness values K increase toward the upper part of the via, which shows etching properties appropriate for forming the V-shaped cross section.

FIG. 12B is a graph showing a result of the working example 2 having an etching gas at a flow rate of 200 sccm. In FIG. 12B, the film thickness values J in the film deposition process without the etching show the same data as those in FIG. 12A, and are constant at around 25 nm even when the depth location varies. In contrast, it is noted that the film thickness values K in the deposition process combined with the etching significantly decrease at around the upper part of the via (TOP and T-SIDE), and that the opening diameter increases toward the upper part of the via. Furthermore, in deep locations (1 through 3 micrometer depth), the film thickness values are smaller than those in FIG. 12A, which indicates that the opening is larger than that in FIG. 12A as a whole.

FIG. 12C is a graph showing a result of the working example 3 having an etching gas at a flow rate of 300 sccm. In FIG. 12C, the film thickness values J in the film deposition process without the etching are the same data as those of FIGS. 12A and 12B, and are constant around 25 nm even when the depth location varies. In contrast, it is noted that the film thickness values K in the combined deposition and etching process decrease toward the top end while an opening diameter increases toward the top end in proportion to the decrease of the film thickness values K and that the film is shaped into a well-featured V shape that has a proportional (linear) sloping surface as a whole. Moreover, the result indicates that the amounts of etching L that are differences between the film thickness values J and the film thickness values K proportionally increase with the decreasing distance from the top of the via and that the etching properties are appropriate for forming the well-featured V shape having a sloping surface with an approximately constant angle.

Thus, the method for depositing the silicon-containing film according to the working examples has indicated that a via can be filled with a silicon oxide film while forming a V-shaped cross section and that a film deposition for filling the via with the silicon oxide film can be performed while preventing a void or a seam from occurring in the silicon oxide film.

As described above, according to the method and apparatus for depositing the silicon-containing film according to the embodiments, a depression formed in a surface of a substrate can be filled with a silicon-containing film without generating a void or a seam in the silicon-containing film.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of manufacturing the silicon oxide film has been described in detail, it should be understood that the various changes, substitutions, and alterations could be made hereto without departing from the spirit and scope of the invention.

What is claimed is:

1. A method for depositing a silicon-containing film, the method comprising:
    causing a silicon-containing gas to adsorb on a first surface of a depression formed in a second surface of a substrate by supplying the silicon-containing gas to the substrate;
    partially etching a silicon component contained in the silicon-containing gas adsorbed on the first surface of the depression by supplying an etching gas to the substrate without using plasma; and
    depositing a silicon-containing film in the depression by supplying a reaction gas reactable with the silicon component to the substrate so as to produce a reaction product by causing the reaction gas to react with the silicon component left in the depression without being etched,
    wherein causing the silicon-containing gas to adsorb on the first surface of the depression, partially etching the silicon component contained in the silicon-containing gas, and depositing the silicon-containing film in the depression constitute a first film deposition cycle, and the first film deposition cycle is performed at least one time.

2. The method as claimed in claim 1, further comprising:
    causing a second silicon-containing gas to adsorb on the first surface of the depression by supplying the second silicon-containing gas to the substrate, the second silicon-containing gas being a same gas as the silicon-containing gas; and
    depositing a second silicon-containing film in the depression by supplying the reaction gas reactable with the silicon component to the substrate so as to produce a second reaction product by causing the reaction gas to react with the silicon component in the depression, the second silicon-containing film and the second reaction product respectively being the same as the silicon-containing film and the reaction product,
    wherein causing the second silicon-containing gas to adsorb on the first surface of the depression and depositing the second silicon-containing film in the depression constitute a second film deposition cycle, and the second film deposition cycle is performed at least one time.

3. The method as claimed in claim 2, wherein the first film deposition cycle is continuously repeated a plurality of times.

4. The method as claimed in claim 3, wherein the second film deposition cycle is repeated a predetermined number of times until the second silicon-containing film is deposited up to a predetermined film thickness, and then the first film deposition cycle is repeated until the depression is filled with the silicon-containing film.

5. The method as claimed in claim 2, wherein the first film deposition cycle is performed one time every time the second film deposition cycle is repeated a predetermined number of times so as to form a cyclic sequence, and the cyclic sequence is performed at least one time.

6. The method as claimed in claim 5, wherein the second film deposition cycle is repeated a second predetermined number of times until the second silicon-containing film is deposited up to a predetermined film thickness, and then the cyclic sequence is repeated until the depression is filled with the silicon-containing film.

7. The method as claimed in claim 2, wherein the first film deposition cycle comprises supplying a purge gas to the substrate between causing the silicon-containing gas to adsorb on the first surface of the depression and partially etching the silicon component contained in the silicon-containing gas.

8. The method as claimed in claim 7, wherein the first film deposition cycle comprises supplying the purge gas to the substrate between partially etching the silicon component contained in the silicon-containing gas and depositing the silicon-containing film in the depression.

9. The method as claimed in claim 8, further comprising:
    placing the substrate on a turntable provided in a process chamber along a circumferential direction of the turntable,
    wherein a silicon-containing gas supply part, an etching gas supply part, and a reaction gas supply part are arranged above the turntable, along the circumferential direction,
    wherein the first film deposition cycle is performed by rotating the turntable so as to cause the substrate to pass through the silicon-containing gas supply part configured to supply the silicon-containing gas to the substrate, the etching gas supply part configured to supply the etching gas to the substrate, and the reaction gas supply part configured to supply the reaction gas to the substrate in this order, and
    wherein the second film deposition cycle is performed by rotating the turntable so as to cause the substrate to pass through the silicon-containing gas supply part configured to supply the silicon-containing gas to the substrate, and the reaction gas supply part configured to supply the reaction gas to the substrate in this order, without supplying the etching gas from the etching gas supply part.

10. The method as claimed in claim 9,
    wherein first and second purge gas supply parts are respectively provided between the silicon-containing gas supply part and the etching gas supply part, and between the reaction gas supply part and the silicon-containing gas supply part, and
    wherein supplying the purge gas to the substrate is performed by rotating the turntable so as to cause the substrate to pass through the first and second purge gas supply parts while supplying the purge gas in the first and second purge gas supply parts.

11. The method as claimed in claim 2, wherein the second film deposition cycle comprises supplying the purge gas to the substrate between causing the second silicon-containing gas to adsorb on the first surface of the depression and depositing the second silicon-containing film in the depression.

12. The method as claimed in claim 1, wherein partially etching the silicon component contained in the silicon-containing gas is performed by supplying chlorine gas as the etching gas.

13. The method as claimed in claim 1, wherein causing the silicon-containing gas to adsorb on the first surface of the depression is performed by supplying an organic aminosilane gas as the silicon-containing gas.

14. The method as claimed in claim 1, wherein depositing the silicon-containing film in the depression is performed by supplying an oxidation gas or a nitriding gas as the reaction gas.

15. The method as claimed in claim 1, wherein the substrate is a silicon wafer, and the depression is a trench or a via hole formed in the second surface of the substrate.

* * * * *